United States Patent
Segawa et al.

(10) Patent No.: US 9,162,921 B2
(45) Date of Patent: Oct. 20, 2015

(54) METHOD OF PRODUCING FLUORESCENT MATERIAL DISPERSED GLASS AND FLUORESCENT MATERIAL DISPERSED GLASS

(75) Inventors: Hiroyo Segawa, Ibaraki (JP); Hisato Yoshimizu, Ibaraki (JP); Satoru Inoue, Ibaraki (JP); Naoto Hirosaki, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 160 days.

(21) Appl. No.: 13/982,647

(22) PCT Filed: Feb. 1, 2012

(86) PCT No.: PCT/JP2012/052268
§ 371 (c)(1),
(2), (4) Date: Jul. 30, 2013

(87) PCT Pub. No.: WO2012/105606
PCT Pub. Date: Aug. 9, 2012

(65) Prior Publication Data
US 2013/0306911 A1    Nov. 21, 2013

(30) Foreign Application Priority Data
Feb. 2, 2011 (JP) .............................. 2011-020298

(51) Int. Cl.
*C03B 8/02* (2006.01)
*H01L 33/50* (2010.01)
*C03C 3/076* (2006.01)
(Continued)

(52) U.S. Cl.
CPC ................ *C03C 14/00* (2013.01); *C03B 19/12* (2013.01); *C03C 1/006* (2013.01); *C03C 3/076* (2013.01); *C03C 4/12* (2013.01); *C03C 14/008* (2013.01); *C09K 11/02* (2013.01); *C03B 2201/24* (2013.01); *C03B 2201/30* (2013.01);
(Continued)

(58) Field of Classification Search
CPC .......... C09K 11/02; C03C 4/12; C03C 3/076; C03C 3/078
USPC ................... 252/301.4 F, 301.4 R; 501/12, 32
See application file for complete search history.

(56) References Cited

U.S. PATENT DOCUMENTS 3,927,224 A * 12/1975 Levene ........................... 427/64

FOREIGN PATENT DOCUMENTS

JP    A06183769    7/1994
JP    A08012342    1/1996
(Continued)

OTHER PUBLICATIONS

International Search Report for PCT/JP2012/052268.
(Continued)

*Primary Examiner* — Carol M Koslow
(74) *Attorney, Agent, or Firm* — Hoffmann & Baron, LLP

(57) ABSTRACT

A method of manufacturing fluorescent material-dispersed glass, comprising: performing production of a fluorescent material-dispersed gel utilizing sol-gel reaction and acid-base reaction by preparing a fluorescent material-dispersed sol containing silicon alkoxide, metal chloride and/or metal aklkoxide, and fluorescent material, and subsequently gelling the fluorescent material-dispersed sol; and performing production of a fluorescent material-dispersed glass by heating the fluorescent material-dispersed gel.

13 Claims, 1 Drawing Sheet

(51) Int. Cl.
*C03C 4/12* (2006.01)
*C03C 14/00* (2006.01)
*C09K 11/02* (2006.01)
*C03C 1/00* (2006.01)
*C03B 19/12* (2006.01)

(52) U.S. Cl.
CPC ........ *C03B 2201/32* (2013.01); *C03B 2201/42* (2013.01); *H01L 33/501* (2013.01)

(56) References Cited

FOREIGN PATENT DOCUMENTS

| | | |
|---|---|---|
| JP | A2002211935 | 7/2002 |
| JP | A2005011933 | 1/2005 |
| JP | A2008019109 | 1/2008 |
| JP | A2010280523 | 12/2010 |
| JP | A2010280797 | 12/2010 |
| JP | A2011162398 | 8/2011 |

OTHER PUBLICATIONS

K. Sakuma, et al., "Warm-white light-emitting diode with yellowish orange SiAION ceramic phosphor," Opt. Lett., 29 (2004), 2001-2003.

R.-J. Xie and N. Hirosaki, "Silicon-based oxynitride and nitride phosphors for white LEDs—A review," Sci. Tech. Adv. Mater., 8 (2007), 588-600.

R.-J. Xie and N. Hirosaki, "Eu2+-doped Ca-α-SiAION: A yellow phosphor for white light-emitting diodes," Appl. Phys. Lett., 84 (2004), 5404-5406.

* cited by examiner

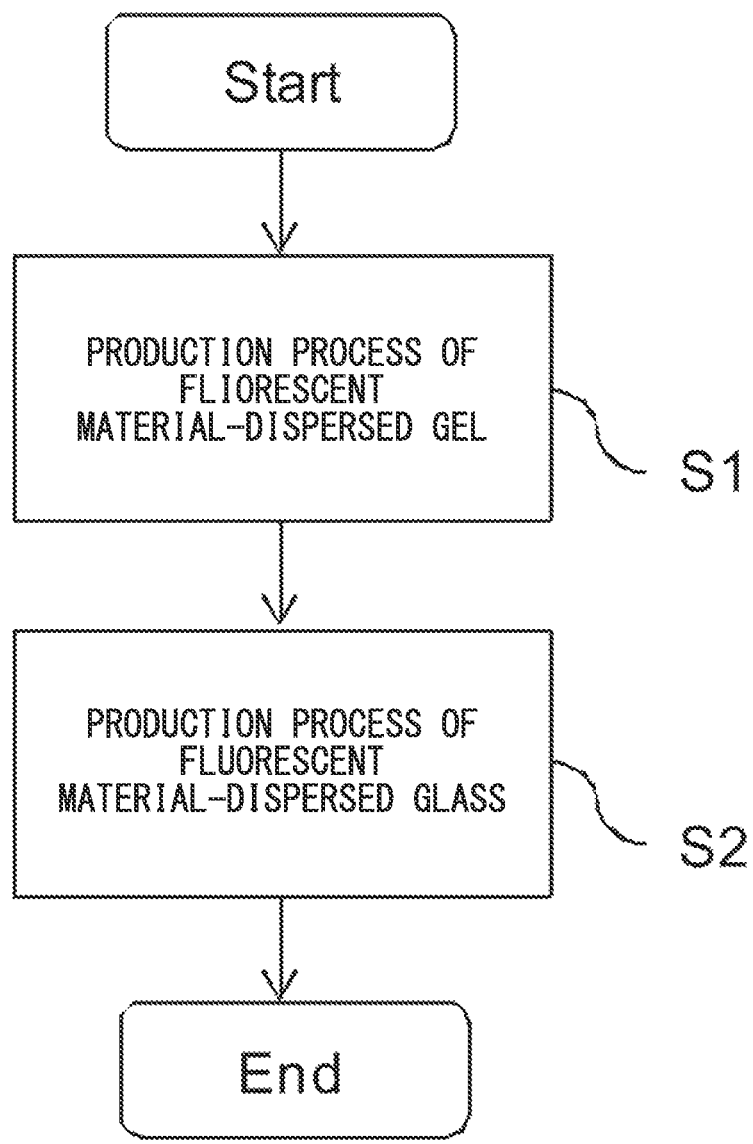

METHOD OF PRODUCING FLUORESCENT MATERIAL DISPERSED GLASS AND FLUORESCENT MATERIAL DISPERSED GLASS

FIELD OF THE INVENTION

The present invention relates to a method of producing a glass dispersed with fluorescent material and a glass dispersed with fluorescent material. Specifically, the present invention relates to a method of producing fluorescent material-dispersed glass using a sol-gel method and acid-base reaction.

Priority is claimed on Japanese Patent Application No. 2011-020298 filed on Feb. 2, 2011, the content of which is incorporated herein by reference.

BACKGROUND ART

In general, polymer materials are used as an encapsulant material that covers a light source of a light emitting diode (LED). In recent years, the polymer encapsulant materials are dispersed with fluorescent material and are used in devices.

For example, Non-Patent Reference 1 describes that an element composed of nitride fluorescent material dispersed in an epoxy resin can be used as an LED having a warm white color.

However, defective deterioration and deformation occasionally occurred in the above-described polymer encapsulant materials due to heat generated by emission of light from the LED light source. The brightness of the LED light source has been enhanced recently. As a result, heat generation has increased, and the problems of insufficient heat endurance of the polymer encapsulant materials has aggravated. On the other hand, non-patent reference 2 describes that the fluorescent materials made of oxynitride and nitride have higher heat endurance compared to oxide fluorescent materials. Therefore, there is an increasing demand for encapsulant materials of still high endurance.

Based on the above-described circumstance, glass materials having relatively high endurance has been investigated as an encapsulant material that can replace the polymer materials.

For example, Patent References 1 and 2 are related to fused glass that seals a light emitting diode. Patent Reference 3 describes a glass formed by a fusion method for dispersing fluorescent material therein, and a method for manufacturing a fluorescent material-dispersed glass by dispersing the fluorescent material in a fused glass.

However, the fused glass requires a reaction process at very high temperature. Therefore, there has been a problem of dagradation of the fluorescent material due to reaction of the fluorescent material with the fused glass during the high temperature reaction process.

For example, Patent Reference 2 describes that the fluorescent material is degradated at a temperature exceeding 900° C. where the fused glass used in the process is mainly composed of $TeO_2$.

Sol-gel method does not require a high temperature reaction process. Therefore, according to the sol-gel method, it is possible to produce a fluorescent material-dispersed glass while suppressing the dagradation of the fluorescent material by avoiding reaction of the fluorescent material with the glass.

For example, Patent Reference 4 describes a fluorescent material-dispersed glass produced by dispersing the fluorescent material in the glass formed by the sol-gel method. Patent Reference 5 describes a fluorescent material-dispersed glass produced by dispersing nano-particles in the glass formed by the sol-gel method.

However, according to the conventional sol-gel method, it is difficult to form a bulk glass, and only a silica glass with low-refractive index can be obtained. Patent Reference 4 also utilizes silica glass and describes that a light of constant color tone can be emitted by controlling the number and size of bubbles. These effects can be obtained by changing the difference of refractive index between the fluorescent material and the glass. For example, if a glass added with $TeO_2$ having high refractive index is obtained, it is possible to control the refractive index of the glass to be similar to that of the fluorescent material, thereby suppressing reduction of emission intensity in the interface between the fluorescent material and glass, and improving the emission efficiency.

Patent Reference 6 describes a fluorescent material-dispersed glass produced by mixing a glass powder and a fluorescent material powder and sintering the mixture. However, the above-described problems could not be solved even when this glass was used.

PRIOR ART REFERENCE

Patent Reference

Patent Reference 1: Japanese Unexamined Patent Application, First Publication No. 2005-11933.
Patent Reference 2: Japanese Unexamined Patent Application, First Publication No. 2008-19109.
Patent Reference 3: Japanese Patent Application No. 2010-027112
Patent Reference 4: Japanese Unexamined Patent Application, First Publication No. 2010-280523.
Patent Reference 5: Japanese Unexamined Patent Application, First Publication No. 2002-211935
Patent Reference 6: Japanese Unexamined Patent Application, First Publication No. 2010-280797

Non Patent Reference

Non Patent Reference 1: K. Sakuma, K. Omichi, N. Kimura, M. Ohashi, D. Tanaka, N. Hirosaki, Y. Yamamoto. R.-J.Xie, T. Suchiro: Opt. Lett., 29 (2004), 2001-2003.
Non Patent Reference 2: R.-J. Xie and N. Hirosaki: Sci. Tech. Adv. Mater., 8 (2007), 588-600.

SUMMARY OF THE INVENTION

Problems to be Solved by the Invention

An object of the present invention is to provide a method of producing a fluorescent material dispersed glass that enable to produce a fluorescent material-dispersed glass constituted of a glass having high refractive index and fluorescent material dispersed in the glass easily while avoiding reaction of the fluorescent material with the glass, and to provide a fluorescent material-dispersed glass.

Solutions for the Problems

A method of manufacturing fluorescent material-dispersed glass (phosphor-dispersed glass) according to the present invention comprises: performing production of a fluorescent material-dispersed gel utilizing sol-gel reaction and acid-base reaction by preparing a fluorescent material-dispersed sol containing silicon alkoxide, metal chloride and/or metal alkoxide, and fluorescent material while avoiding reaction of the fluorescent material with the sol, and subsequently gelling the fluorescent material-dispersed sol; and performing production of a fluorescent material-dispersed glass by heating the fluorescent material-dispersed gel while avoiding reaction of the fluorescent material with the glass.

In the above-described method of manufacturing a fluorescent-material dispersed glass, the silicon alkoxide may be shown by a formula, $Si(OR)_4$, the metal chloride may be shown by a formula, $MCl_n$, and the metal alkoxide may be shown by a formula, $M(OR)_n$, where the OR demotes an alkoxyl group, M denotes a metal, and n denotes an integer corresponding to the species of the metal.

In the above-described method of manufacturing fluorescent material dispersed glass, M may be one selected from Te, Ti, and Sn, and n may be 2 or 4.

In the above-described method of manufacturing fluorescent material dispersed glass, the $MCl_n$ may be one selected from $TeCl_4$, $TiCl_4$, $SnCl_2$, and $SnCl_4$ and the $M(OR)n$ may be one selected from $Te(OR)_4$, $Ti(OR)_4$, $Sn(OR)_2$, and $Sn(OR)_4$.

In the above-described method of manufacturing fluorescent material dispersed glass, the alkoxyl group OR may be one selected from methoxy group, ethoxy group, propoxy group, isopropoxy group, and butoxy group.

In the above-described method of manufacturing fluorescent material dispersed glass, it is preferable to form the fluorescent material-dispersed sol such that the metal chloride and/or metal alkoxide is less than 3/7 mol per 1 mol of the silicon alkoxide.

In the above-described method of manufacturing fluorescent material dispersed glass, it is preferable to control the amount of the fluorescent material in the fluorescent material-dispersed glass to be 10% by mass or less.

In the above-described method of manufacturing fluorescent material dispersed glass, the fluorescent material is preferably a material selected from nitride, oxide, and oxynitride.

In the above-described method of manufacturing fluorescent material dispersed glass, the oxynitride is preferably SiAlON.

In the above-described method of manufacturing fluorescent material dispersed glass, it is preferable to form a precursor sol of high viscosity by hydrolysis and condensation polymerization of the silicon alkoxide and metal chloride and/or the metal alkoxide.

In the above-described method of manufacturing fluorescent material dispersed glass, the viscosity of the precursor sol is preferably in the range of 100 to 10000 mPa·s.

In the above-described method of manufacturing fluorescent material dispersed glass, it is preferable to form the fluorescent material-dispersed sol by dispersing the fluorescent material in the precursor sol.

In the preparation of the above-described precursor sol, a mixture of the silicon alkoxide and metal chloride and/or metal alkoxide may be subjected to hydrolysis by being added with water.

Alternatively, the metal chloride and/or the metal hydroxide may be added after hydrolysis of the silicon alkoxide added with water.

Preferably, the above-described water has a pH less than 7 or a pH exceeding 7.

In the above-described method of manufacturing fluorescent material dispersed glass, it is preferable to vitrify (glassify) the fluorescent material dispersed gel by heating the gel.

In the above-described method of manufacturing fluorescent material-dispersed glass, it is preferable to form the fluorescent material dispersed gel by, after forming the fluorescent material-dispersed sol, aging the fluorescent material-dispersed sol for 1 hour or longer at a temperature of 20° C. or more.

In the above-described method of manufacturing fluorescent material-dispersed glass, it is preferable to form the fluorescent material-dispersed glass by heating the fluorescent material-dispersed gel at a temperature of 350° C. or more.

A fluorescent material-dispersed glass according to the present invention includes $MO_n$—$SiO_2$ glass, and fluorescent material dispersed in the $MO_n$—$SiO_2$ glass, wherein the $MO_n$ denotes one metal oxide selected from $TeO_2$, $TiO_2$, $SnO_2$, and SnO, where a fraction of the $MO_n$ is not higher than 30 mol %, and the amount of fluorescent material is not higher than 10% by mass.

In the above-described fluorescent material dispersed glass, the fluorescent material is preferably a material selected from nitride, oxide, or oxynitride. Preferably, the oxynitride may be SiAlON.

Effect of the Invention

The method of manufacturing fluorescent material-dispersed glass according to the present invention includes forming a fluorescent material-dispersed gel by sol-gel method and acid-base reaction by forming a fluorescent material-dispersed sol through hydrolysis and condensation polymerization of silicon alkoxide, salt and/or alkoxide of metal such as Te, Ti, Sn, and forming the fluorescent material-dispersed glass by heating the fluorescent material-dispersed gel. Since the fluorescent material is added to a sol of high viscosity after sufficient reaction of silicon alkoxide and salt or alkoxide of the metal M, the fluorescent material escapes from reaction with the sol, and therefore, can be dispersed homogeneously in the gel.

Since the fluorescent material-dispersed sol is prepared such that the fraction of metal M is 3/7 mol or less per 1 mol of the silicon alkoxide, it is possible to form a fluorescent material-dispersed gel including the fluorescent material dispersed high refractive index glass by sol-gel reaction and acid-base reaction while avoiding reaction of the fluorescent material with the glass. Subsequently, by heating the fluorescent material-dispersed gel, it is possible to easily produce a fluorescent material-dispersed glass including fluorescent material homogeneously dispersed in a glass of high refractive index.

BRIEF EXPLANATION OF DRAWING

FIG. 1 is a flow-chart that shows a method of manufacturing fluorescent material-dispersed glass according to the present invention.

MODE FOR CARRYING OUT THE INVENTION

Embodiment of the Present Invention

In the following, a method of manufacturing fluorescent material-dispersed glass and a fluorescent material-dispersed glass according to the present invention will be explained with reference to the drawing.

A Method of Producing Fluorescent Material-dispersed Glass.

As shown in FIG. 1, a method of manufacturing fluorescent material-dispersed glass as an embodiment of the present invention includes a production of fluorescent material-dispersed gel (hereafter referred to as fluorescent material-dispersed gel production process S1) and a production of a fluorescent material-dispersed glass (hereafter referred to as fluorescent material-dispersed glass production process S2).

Fluorescent Material-dispersed Gel Production Process S1

The fluorescent material-dispersed gel production process S1 utilizes sol-gel reaction and acid-base reaction, and includes production of fluorescent material-dispersed sol containing silicon alkoxide, metal chloride and/or metal alkoxide, and fluorescent material, and subsequently forming a fluorescent material-dispersed gel from the fluorescent material-dispersed sol by sol-gel method. That is, this process includes production process of fluorescent material-dispersed sol and gelation process of the sol.

Silicon alkoxide is shown by $Si(OR)_4$. Alkyl group constituting the alkoxyl group may be selected from ethyl group, propyl group, and isopropyl group. That is, alkoxyl group OR may be selected from methoxy group, ethoxy group, propoxy group, isopropoxy group or the like.

Metal chloride is expressed by $MCl_n$ and metal alkoxide is expressed by $M(OR)_n$, where n is an integer corresponding to the metal species. Alkyl group metal group may be selected from ethyl group, propyl group, methyl group, isopropyl group, butyl group or the like. That is, alkoxyl group may be selected from methoxy group, ethoxy group, propoxy group, isopropoxy group, and butoxy group.

For example, metal M may be selected from Te, Ti, and Sn. In this case, n may be an integer of 2 or 4. For example, $MCl_n$ may be one selected from $TeCl_4$, $TiCl_4$, $SnCl_2$, and $SnCl_4$, and $M(OR)_n$ may be one selected from $Te(OR)_4$, $Ti(OR)_4$, $Sn(OR)_2$, and $Sn(OR)_4$.

For example, the silicon alkoxide used in the embodiment may be one selected from tetramethoxysilane and tetraethoxysilane. Silicon alkoxide and metal chloride may be used. For example, the above silicon alkoxide and one metal chloride selected from tellurium chloride, titanium chloride, and tin chloride may be used. Hydrate may be used as the metal chloride. The metal chloride and metal alkoxide may be used in combination. For example, titanium chloride and titanium isopropoxide may be used.

In the preparation process of the fluorescent material-dispersed sol, a precursor sol may be firstly formed by using silicon alkoxide, metal chloride and/or metal alkoxide, and water, and the fluorescent material-dispersed sol may be formed by dispersing the fluorescent material in the precursor sol.

In this case, the silicon alkoxide and metal chloride and/or metal alkoxide may be mixed preliminarily, and the solution (sol) may be formed by adding water to the mixture to perform hydrolysis. In another way, the solution (sol) may be formed by firstly subjecting the silicon alkoxide to hydrolysis by the addition of water, and subsequently forming the solution (sol) by mixing the hydrolysed sol with other materials.

Alcohol such as methanol, ethanol, propanol, and/or propylene glycol monomethylether acetate, THF or the like may be added as a solvent to the above-described solutions. Drying control chemical additive such as dimethylformamide (DMF) and propylene carbonate may also be added. These additives may be added after adding water to the silicon alkoxide and metal chloride and/or metal alkoxide, or may be added in the time of hydrolysis of silicon alkoxide. Alternatively, the additives may be added with the metal alkoxide after the hydrolysis of the silicon alkoxide.

Mixing ratio of the silicon alkoxide and the metal chloride and/or the metal alkoxide is not particularly limited. It is preferable that molar ratio of metal M to Si, M/Si exceeds 0 so as to provide a refractivity different from that of silica glass. The molar ratio M/Si is preferably not larger than 3/7, more preferably less than 3/7. Where M/Si has a large value, it is difficult achieve a homogeneous sol. For example, the molar ratio M/Si may be in the range from 0.1 to 0.25.

The relative amount of water is preferably controlled to be 1 to 10 mol, preferably 2 to 4 mol, per 1 mol of Si+M (total of silicon and metallic element). By this constitution, it is possible to form a transparent bulk glass through vitrification. The relative amount of the water less than 1 mol is not preferred since the reaction does not proceed in this amount and it is difficult to achieve a sol of high viscosity. The relative amount of water more than 10 mol is not preferred since the reaction proceeds rapidly in this amount resulting in deposition of precipitates.

The relative amount of alcohol is preferably controlled to be 0 to 30 mol, more preferably 2 to 10 mol per 1 mol of Si+M.

The relative amount of drying control chemical additive is preferably controlled to be 0 to 20 mol, more preferably 1 to 5 mol per 1 mol of Si+M.

Diluted water having pH of about 7 may be used as the water used in hydrolysis. Preferably, water having pH of less than 7 or pH of more than 7 is used. More preferably, pH of the water is controlled to be 3 or less or 10 or more. The pH of the water may be controlled to be 1 or more and 2 or less. Preferably, pH of the water may be controlled using acid such as hydrochloric acid, sulfuric acid, nitric acid, fluoric acid, or base such as ammonium solution or sodium hydroxide solution.

Where the pH is controlled to be less than 7, excessive $H^+$ groups attack the silicon alkoxide and the alkoxyl groups (—OR) are one by one converted to (—OH) group by the hydrolysis reaction shown by the below described reaction formula (1). Methyl group, ethyl group, or propyl group are preferred as the R.

$$Si(OR)_4 + H_2O \rightarrow (HO)\text{—}Si\text{—}(OR)_3 + ROH \qquad (1)$$

It is possible to proceed the hydrolysis reaction rapidly by controlling the pH to be less than 7.

The reaction rate of the hydrolysis increases with decreasing pH, and the reaction rate decreases as the pH value approaches to 7. By controlling the pH to be 1 or more and 2 or less, it is possible to perform the hydrolysis at an optimum reaction rate.

On the other hand, where the pH exceeds 7, excessive $OH^-$ group attacks silicon alkoxide, resulting in abrupt reaction of the all four of alkoxyl groups. As a result, hydrolysis reaction as shown by the below described reaction formula (2) occurs.

$$Si(OR)_4 + 4H_2O \rightarrow Si(OH)_4 + 4ROH \qquad (2)$$

It is preferable to perform the hydrolysis at 20 to 90° C., preferably at a heated condition of 26° C. to 60° C. By performing the hydrolysis at 20 to 90° C., it is possible to form a homogeneous sol. The temperature lower than 20° C. is not preferable since very long time of 10 days or longer is required for forming the sol at that temperature. On the other hand, where the temperature exceeds 90° C., it is not preferable since denaturation of raw material occurs during the reaction.

The hydrolysis is preferably performed by holding the reaction system at the above-described temperature. Elevation of viscosity differs in accordance with species of the raw materials. Longer time is required as the molecular weight of the R increases from methyl group to ethyl group to propyl group.

Sol-gel reaction is a reaction including hydrolysis reaction and condensation and polymerization reaction. The condensation polymerization reaction is shown by the below-described formula (3) and (4), and generally generates $SiO_2$ having Si—O—Si bond. Similar hydrolysis reaction occurs where alkoxide including Ti, Sn, or Te as M is added. As a result, $SiO_2$-$MO_n$ having a Si—O-M bond is generated.

$$Si(OH)_4+Si(OR)_4 \to 2SiO_2+4ROH \quad (3)$$

$$Si(OH)_4+Si(OH)_4 \to 2SiO_2+4H_2O \quad (4)$$

Where chloride including metal M is used as a raw material, the reaction shown by the following formula (5) occurs.

$$MCl_n+R'OH \to M(OR')_n+HCl \quad (5)$$

By this reaction, hydrolysis and condensation polymerization reaction similar to the reaction shown by the formula (1) to (4) occurs.

In addition, acid-base reaction shown by the formula (6) also proceeds and a gel of $SiO_2$-$MO_n$ having Si—O-M bond is generated.

$$Si(OH)_4+MCl \to SiO_2\text{-}MO_n+4HCl\uparrow \quad (6)$$

It is preferable to perform the stirring until the viscosity of sol is increased to 100 to 10000 mPa·s by hydrolysis and condensation polymerization reaction. The viscosity is preferably controlled to be 500 to 3000 mPa·s. Preferably, the reaction is performed at a temperature of 20 to 80° C., more preferably at a heated temperature of 26 to 60° C. It is possible to produce homogeneous sol by performing the hydrolysis at a temperature of 20 to 80° C. The temperature lower than 20° C. is not preferred since very long time of 10 days or longer is required for forming the sol at that temperature. On the other hand, where the temperature exceeds 80° C., it is not preferable since modification of raw material occurs during the reaction.

It is preferable to disperse the fluorescent material during the sol-gel reaction or the acid-base reaction. Preferably, the fluorescent material is dispersed in the sol after the sol achieving high viscosity by progress of sol-gel reaction or acid-base reaction through continued stirring. By this treatment, it is possible to form a fluorescent material-dispersed sol including the fluorescent material homogeneously dispersed therein, and the sol is solidified while avoiding deposition of the fluorescent material after stopping the stirring. As a result, fluorescent material-dispersed gel can be obtained.

The fluorescent material may be selected from the commercially available materials. For example, it is preferable to select the fluorescent material from nitride fluorescent material, oxide fluorescent material, oxynitride fluorescent material, sulfide fluorescent material, oxysulfide fluorescent material, halide fluorescent material or the like. These materials may be added homogeneously in the $SiO_2$-$MO_n$ glass easily.

For example, the fluorescent material may be preferably selected from SiAlON. For example, Ce-doped YAG may be used as the oxide fluorescent material, and $CaAlSiN_2$ may be used as the oxide fluorescent material.

Preferably, the amount of fluorescent material in the glass is controlled to be more than 0 mass % and not more than 10 mass %. It is possible to disperse the fluorescent material homogeneously where the amount of the fluorescent material is 10 mass % or less. As a result, it is possible to produce a fluorescent material-dispersed glass having high luminous efficiency. The amount of the fluorescent material exceeding 10 mass % is not preferred because of difficulty in forming a bulk glass in the time of vitrification.

After forming the fluorescent material-dispersed sol, it is preferable to leave the sol for one hour or longer at a temperature of 10 to 50° C. so as to age the sol before heating the sol. By this treatment, it is possible to strengthen the framework of the fluorescent material-dispersed gel, thereby manufacturing a glass that is resistant to fracture.

The temperature of aging is preferably controlled to be 25 to 35° C. By aging the sol at a temperature of 20° C. or higher, the sol-gel reaction further proceeds, and thereby making it possible to maintain dispersion state of fluorescent material in a stable gel. Where the temperature is lower than 25° C., progressing rate of the aging is decreased. Preferably, the gel is aged for a long time where low temperature is used. Where the gel is aged for sufficiently long time after the completion of gelation, the density of the gel is increased by releasing alcohol or water generated by the reaction to outer environment. Although the upper limit of the aging time is not particularly limited, the time exceeding 48 hours is not preferred because of deterioration of production efficiency.

Production of Fluorescent Material-Dispersed Glass S2

Production step of fluorescent material-dispersed glass S2 is a process of forming a fluorescent material-dispersed glass by heating the above-described fluorescent material-dispersed gel.

Firstly, it is necessary to remove alcohol, water, drying control chemical additive or the like that remain in large amount in the fluorescent material-dispersed gel. Since strong capillary force functions in the vicinity of vaporization temperature of these materials, the gel is heated with a slow heating rate.

The heating step may be performed by one step heating to elevate the temperature to a predetermined temperature with a constant heating rate. In general, the heating step is performed by multi-step heating in which the temperature of the gel is elevated stepwise.

In the following, three step heating process is explained as an example.

First Step

Firstly, temperature of the gel is elevated from room temperature (26° C.) to a first temperature with a predetermined heating rate, and is maintained at that temperature for a certain time.

The first heating temperature is preferably 50 to 100° C., more preferably 70 to 90° C. By this heating, framework of the gel is strengthened by shrinkage of the framework while evaporating alcohol slowly. Where the first heating temperature is lower than 50° C., reaction rate of the above-described reaction is decreased. On the other hand, where the temperature exceeds 100° C., it is not preferred due to partial evaporation of the sol.

The heating rate is preferably controlled to be 0.1 to 5° C./h, more preferably 1 to 3° C./h. By using this rate, it is possible to evaporate alcohol slowly. Although the above-described reaction proceeds with sufficient reaction rate where the hearting rate is smaller than 0.1° C./h, this heating rate is not preferred due to deterioration of production efficiency. On the other hand, heating rate exceeding 5° C./h is not preferred since cracking tends to occur during the drying process.

After reaching the first heating temperature, a few holes are formed on the cover and the gel is aged for preferably 10 to 240 hours, more preferably 20 to 50 hours. By this treatment, it is possible to dry the alcohol released by the reaction efficiently. Where the time is shorter than 10 hours, the gel cannot be dried sufficiently and tends to occur cracking due to drying in the subsequent process. On the other hand, where the time exceeds 240 hour, it is not preferable since the production efficiency is deteriorated.

Second Step

Next, the temperature of the gel is elevated from the first heating temperature to the second heating temperature with a predetermined heating rate, and is maintained at that temperature for a certain time (hereafter, referred to as drying step). The drying step is a process of drying fluorescent material-dispersed gel.

Preferably, the second heating temperature is controlled to be not lower than the first heating temperature and not higher than 200° C., more preferably, controlled to be not lower than the first heating temperature and not higher than 180° C. More preferably, the second heating temperature is controlled to be higher than the first heating temperature and not higher than 180° C. By this heating, it is possible to dry out the residual water and drying control chemical additive completely. Where the second heating temperature is controlled to be lower than the first heating temperature, it is not preferable since the gel cannot be dried completely. On the other hand, where the second heating temperature exceeds 200° C., it is not preferred since carbonization of the residual organic material starts to occur, resulting in coloration of the gel.

Preferably, the heating rate (temperature elevation rate) is controlled to be 1 to 5° C./h, more preferably 2 to 3° C./h. By using this heating rate, it is possible to perform drying efficiently. Where the heating rate is smaller than 1° C./h, it is not preferred since the production efficiency is deteriorated while the gel can be dried sufficiently. On the other hand, where the heating rate exceeds 5° C./h, it is not preferred since cracks are generated due to rapid drying of the gel.

Preferably, keeping time is controlled to be 12 to 240 hours, more preferably, 24 to 48 hours. By this setting, it is possible to dry the gel completely. Where the keeping time is shorter than 12 hours, the gel cannot be dried completely. On the other hand, where the keeping time exceeds 48 hours, it is not preferred since the production efficiency is deteriorated.

Third Step

Next, the dried gel is heated from the room temperature to the third heating temperature with a predetermined heating rate, and is kept at that temperature for a certain time (hereafter, this process is referred to as vitrification process). The vitrification process is performed to completely remove the organic material and to vitrify the fluorescent material-dispersed gel by sintering the gel.

Preferably, the third heating temperature is controlled to be 350 to 1100° C., where the temperature differs depending on the species of M. It is not desirable to control the temperature to be lower than 400° C. since the organic material is not removed sufficiently resulting in coloration of the gel due to carbonization of the residual organic material. On the other hand, excessively high temperature is not preferred since partial crystallization occurs resulting in white glass.

Preferably, the heating rate is controlled to be 50° C./h or less, more preferably, 3 to 30° C./h. By using this heating rate, it is possible to perform the vitrification efficiently. Heating rate of smaller than 3° C./hr is not preferred since the production efficiency is deteriorated. On the other hand, heating rate exceeding 50° C./h is not preferred since cracking tends to occur.

Preferably, keeping time is controlled to be 1 to 240 hours, more preferably, 2 to 4 hours. By this setting, sintering of the gel progresses sufficiently, resulting in formation of a glass. Where the keeping time is shorter than 1 hour, the vitrification is not completed in partial portions of the gel. Keeping time longer than 240 hours is not preferred since the production efficiency is deteriorated.

After the above-described process, the glass is cooled spontaneously to the room temperature in the electric furnace. Thus a fluorescent material-dispersed glass is manufactured.

Fluorescent Material-dispersed Glass

The fluorescent material-dispersed glass according to an embodiment of the present invention is mainly constituted to have $MO_n$—$SiO_2$ glass and the fluorescent material dispersed in the $MO_n$—$SiO_2$ glass, where $MO_n$ denotes a metal oxide component in the glass and may be selected from $TeO_2$, $TiO_2$, $SnO_2$, and $SnO$ or the like.

$MO_n$ in the $MO_n$—$SiO_2$ glass is controlled to be 30 mol % or less. By this setting, it is possible to make the $MO_n$—$SiO_2$ glass have a stable structure. Where the $MO_n$ exceeds 30 mol %, it is difficult to vitrify the gel. In addition, it is difficult to extract the fluorescent light from the fluorescent material due to deterioration of transparency of the glass caused by formation of crystals.

Preferably, outer percentage of the fluorescent material with respect to the total amount of $MO_n$—$SiO_2$ glass is 10 mass % or less. By this setting, it is possible to disperse the fluorescent material homogeneously in the Si—O-M system, resulting in formation of fluorescent material-dispersed glass having high luminous efficiency.

The fluorescent material may be selected from the fluorescent materials described in the above explained method of producing fluorescent material-dispersed glass.

Preferably, the fluorescent material is selected from nitride, oxide, or oxynitride. Specifically, the oxynitride may be SiAlON. By using such a fluorescent material, it is possible to form a fluorescent material-dispersed glass having high quantum efficiency.

For example, where the glass is formed by homogeneously dispersing the SiAlON fluorescent material having high refractive index in a glass added with $TeO_2$ of high refractive index, it is possible to control the refractive index of the fluorescent material and the refractive index of the glass in a similar level, thereby decreasing the influence of scattered light, suppressing the deterioration of emission intensity in the interfaces between the fluorescent materials and the glass, and enhancing the quantum efficiency.

An embodiment of a method of producing a fluorescent material-dispersed glass according to the present invention includes: a process of forming a fluorescent material-dispersed gel using a sol-gel reaction and acid-base reaction by forming a fluorescent material-dispersed sol containing tetramethoxysilane, tellurium chloride, and fluorescent material, and subsequently forming a fluorescent material-dispersed gel from the fluorescent material-dispersed sol; and a process of forming a fluorescent material-dispersed glass by heating the fluorescent material-dispersed gel, wherein the fluorescent material-dispersed sol is prepared such that fraction of the tellurium chloride is 3/7 mol or less per 1 mol of tetramethoxysilane. By this constitution, it is possible to produce a fluorescent material-dispersed gel in which the fluorescent material is dispersed in a high refractive index glass while avoiding reaction of the fluorescent material with the glass. By subsequently heating the fluorescent material-dispersed gel, it is possible to easily produce the fluorescent material-dispersed glass in which the fluorescent material is dispersed in a high refractive index glass.

As an another embodiment of the present invention, it is possible to apply a method of producing a fluorescent material-dispersed glass, including: preparing a fluorescent material-dispersed sol using tetraethoxysilane, tellurium chloride, and fluorescent material, subsequently forming a fluorescent material-dispersed gel by gelation of the sol, and forming a fluorescent material-dispersed glass by heating the fluorescent material-dispersed gel.

As an another embodiment of the present invention, it is possible to apply a method of producing a fluorescent material-dispersed glass, including: preparing a fluorescent material-dispersed sol using tetramethoxysilane, titanium chloride, titanium isopropoxide, and fluorescent material, subsequently forming a fluorescent material-dispersed gel by gelation of the sol, and forming a fluorescent material-dispersed glass by heating the fluorescent material-dispersed gel.

As an another embodiment of the present invention, it is possible to apply a method of producing a fluorescent material-dispersed glass, including: preparing a fluorescent material-dispersed sol containing tetramethoxysilane, tin chloride, and, subsequently forming a fluorescent material-dispersed gel by gelation of the sol, and forming a fluorescent material-dispersed glass by heating the fluorescent material-dispersed gel.

The fluorescent material-dispersed glass as an embodiment of the present invention includes a $MO_n$—$SiO_2$ glass and fluorescent material dispersed in the $MO_n$—$SiO_2$ glass, wherein the metal oxide $MO_n$ is less than 30 mol %, and the fluorescent material is 10 mass % or less. By this constitution, it is possible to make the $MO_n$—$SiO_2$ glass of high refractivity to have a stable structure, and to disperse the fluorescent material homogenously.

The use of fluorescent material-dispersed glass according to the present invention is not particularly limited. For example, where the fluorescent material-dispersed glass is used as an encapsulant material of LED, it is possible to encapsule the LED light source in the fluorescent material-dispersed sol or fluorescent material-dispersed gel, and subsequently vitrify the gel. By this treatment, it is possible to encapsule the LED in the fluorescent material-dispersed glass while avoiding deterioration of luminous efficiency of the fluorescent material due to high temperature treatment. In addition, since the metal oxide component is added to the glass, it is possible to obtain more satisfactory luminous property compared to the case where the fluorescent material is dispersed in the silica glass.

The method of producing a fluorescent material-dispersed glass and the fluorescent material-dispersed glass according to embodiments of the present invention are not limited to the above-explained embodiments. Various modifications to the embodiments may be made within the technical scope of the present invention. While practical examples of the present embodiment are shown in the below described Examples, the present invention is not limited to those Examples.

EXAMPLES

Example 1

Firstly, 1.90 ml (0.106 mol) of water of pH2 was added to 8.08 g (0.053 mol) of tetramethoxysilane (TMOS), where the pH of the water was controlled using hydrochloric acid. Sol was prepared by hydrolysis of the TMOS at 50° C. for 6 hours.

1.43 g (0.0053 mol) of tellurium chloride ($TeCl_4$) was added to the sol, and the sol was subsequently stirred for 5 minutes at room temperature (reaction temperature: 26° C.). After that, fluorescent material-dispersed sol was prepared by adding 0.08 g of SiAlON fluorescent material to the sol.

Next, a fluorescent material-dispersed gel was formed by aging the fluorescent material-dispersed sol for 1 hour at 26° C. The gel was aged by keeping the gel for 12 hours at room temperature.

Next, the fluorescent material-dispersed gel was placed inside an oven, and the temperature was raised from 26° C. to 80° C. with a heating rate of 2.7° C./h. The fluorescent material-dispersed gel was subsequently dried for 1 day at 80° C.

Further, the temperature was raised from 80 to 150° C. with a heating rate of 2.9° C./h. After that, the gel was kept for 1 day at 150° C. Thus a dried gel was obtained.

Temperature was raised from 150 to 400° C. with a heating rate of 20° C./h. The gel was kept at 400° C. for 2 hours and subsequently cooled spontaneously inside an electric furnace. Thus a fluorescent material-dispersed glass was obtained.

Next, the fluorescent material-dispersed glass was processed to a platy shape having a thickness of 3 mm and dimensions of 5 mm×10 mm, and both surfaces of the glass plate were mirror polished. Thus, a fluorescent material-dispersed glass of Example 1 was obtained.

Where the fluorescent material-dispersed glass was excited by a light of 450 nm (excitation wavelength of SiAlON fluorescent material), luminescence was detected in wide wavelength range from 500 to 780 nm with the peak intensity at 585 nm. The color coordinate was x=0.40, y=0.32. That is, the emission light has substantially white color.

The quantum efficiency was 28%. The quantum efficiency is a percentage ratio of emission energy measured using an integrating sphere over the energy of excitation light irradiated on the sample.

Example 2

A fluorescent material-dispersed glass of Example 2 was prepared in a similar manner as Example 1 except that hydrolysis was performed for 3 hours.

Example 3

A fluorescent material-dispersed glass of Example 3 was prepared in a similar manner as Example 1 except that hydrolysis was performed for 10 hours.

Example 4

A fluorescent material-dispersed glass of Example 4 was prepared in a similar manner as Example 1 except that 3.58 g (0.013 mol) of tellurium chloride was used.

Example 5

Firstly, after mixing 8.08 g (0.053 mol) of tetramethoxysilane and 1.43 g (0.0053 mol) of tellurium chloride, 1.90 ml (0.106 mol) of water of pH2 was added to the mixture, where the pH of the water was controlled using hydrochloric acid. After the hydrolysis of the mixture at 26° C. for 20 minutes, 0.08 g of SiAlON fluorescent material was added to the mixture.

Next, a fluorescent material-dispersed gel was formed by aging the fluorescent material-dispersed sol for 1 hour at 26° C. Next, the fluorescent material-dispersed gel was heated from the room temperature to 80° C. with a heating rate of 2.7° C./h. The fluorescent material-dispersed gel was subsequently dried for 1 day. Next, the temperature was raised to 150° C. with a heating rate of 2.9° C./h, and the gel was dried for 1 day. Temperature was raised to 400° C. with a heating rate of 20° C./h. The gel was kept for 2 hours at 400° C. and subsequently cooled spontaneously inside the electric furnace. Thus a fluorescent material-dispersed glass was obtained. The fluorescent material-dispersed glass was processed in a similar manner as Example 1, and a fluorescent material-dispersed glass of Example 5 was prepared.

Example 6

A fluorescent material-dispersed glass of Example 6 was prepared in a similar manner as Example 1 except that 0.02 g of SiAlON fluorescent material was added.

Example 7

A fluorescent material-dispersed glass of Example 7 was prepared in a similar manner as Example 1 except that 0.2 g of SiAlON fluorescent material was added.

Example 8

A fluorescent material-dispersed glass of Example 8 was prepared in a similar manner as Example 1 except that water of pH 3 was used.

Example 9

A fluorescent material-dispersed glass of Example 9 was prepared in a similar manner as Example 1 except that water of pH 4 was used.

Example 10

Firstly, after mixing 4.57 g (0.03 mol) of tetramethoxysilane and 0.898 g (0.0033 mol) of tellurium chloride, 1.20 ml (0.067 mol) of water of pH 2 was added to the mixture, where the pH of the water was controlled using hydrochloric acid. After the hydrolysis of the mixture at 26° C. for 3 hours, 0.04 g of SiAlON fluorescent material was added to the mixture.

Next, a fluorescent material-dispersed gel was formed by aging the fluorescent material-dispersed sol for 1 hour at 26° C. Next, the fluorescent material-dispersed gel was heated from the room temperature to 80° C. with a heating rate of 2.7° C./h. The fluorescent material-dispersed gel was subsequently dried for 1 day. Next, the temperature was raised to 150° C. with a heating rate of 2.9° C./h, and the gel was dried for 1 day. Temperature was raised to 400° C. with a heating rate of 20° C./h. The gel was kept for 2 hours and subsequently cooled spontaneously inside the electric furnace. Thus a fluorescent material-dispersed glass was obtained. The fluorescent material-dispersed glass was processed in a similar manner as Example 1, and a fluorescent material-dispersed glass of Example 10 was prepared.

Example 11

A fluorescent material-dispersed glass of Example 11 was prepared in a similar manner as Example 10 except that the hydrolysis before the addition of the fluorescent material was performed for 3 hours at 50° C.

Example 12

A fluorescent material-dispersed glass of Example 12 was prepared in a similar manner as Example 10 except that the pH of the water used in the hydrolysis was controlled to be 10 using ammonium solution.

Example 13

A fluorescent material-dispersed glass of Example 13 was prepared in a similar manner as Example 10 except that the pH of the water used in the hydrolysis was controlled to be 10 using ammonium solution, and that the hydrolysis before adding the fluorescent material was performed for 3 hours at 50° C.

Example 14

Firstly, 4.04 g (0.027 mol) of tetramethoxysilane was subject to hydrolysis using 0.972 ml (0.054 mol) of water of pH 2 for 6 hours at 50° C. Subsequently, the hydrolysate was added to a solution that was prepared by adding 0.727 g (0.0027 mol) of tellurium chloride in 0.864 g (0.027 mol) of methanol and dissolving the tellurium chloride by stirring for 1 hour at 26° C.

Next, after stirring of the solution for five minutes at 26° C., 0.08 g of SiAlON fluorescent material was added to the solution.

Next, the temperature was raised from room temperature to 80° C. with a heating rate of 2.7° C./h, and the obtained gel was aged for 1 day. Next, the temperature was raised to 150° C. with a heating rate of 2.9° C./h, and the gel was dried for 3 days. Temperature of the obtained dry gel was raised to 400° C. with a heating rate of 20° C./h. The gel was kept for 2 hours and subsequently cooled spontaneously inside the electric furnace. Thus obtained fluorescent material-dispersed glass was processed in a similar manner as Example 1, and a fluorescent material-dispersed glass of Example 14 was prepared.

Example 15

Firstly, 4.57 g (0.03 mol) of tetramethoxysilane was subject to hydrolysis using 1.08 ml (0.06 mol) of water of pH 2 for 7 hours at 50° C., where the pH value of the water was controlled using hydrochloric acid. Subsequently, the hydrolysate was added to a solution that was prepared by adding 0.898 g (0.0033 mol) of tellurium chloride in 1.92 g (0.06 mol) of methanol and dissolving the tellurium chloride by stirring for 1 hour at 26° C.

Next, after stirring of the solution for five minutes at 26° C., 0.04 g of SiAlON fluorescent material was added to the solution. Next, the temperature was raised from room temperature to 80° C. with a heating rate of 2.7° C./h, and the obtained gel was aged for 1 day. Next, the temperature was raised to 150° C. with a heating rate of 2.9° C./h, and the gel was dried for 3 days. Temperature of the obtained dry gel was raised to 400° C. with a heating rate of 20° C./h. The gel was kept for 2 hours and subsequently cooled spontaneously inside the electric furnace. Thus obtained fluorescent material-dispersed glass was processed in a similar manner as Example 1, and a fluorescent material-dispersed glass of Example 15 was prepared.

Example 16

A fluorescent material-dispersed glass of Example 16 was prepared in a similar manner as Example 15 except that the hydrolysis of the tetramehtoxysilane was performed for 3 hours at 50° C.

Example 17

A fluorescent material-dispersed glass of Example 17 was prepared in a similar manner as Example 15 except that the hydrolysis of the tetramehtoxysilane was performed for 3 hours at 50° C., and that the amount of methanol for dissolving tellurium chloride was controlled to be 3.84 g (0.12 mol).

Example 18

0.972 ml (0.054 mol) of water was added to 4.04 g (0.027 mol) of tetramethoxysilane and 1.94 g (0.0108 mol) of methanol, where pH of the water was controlled to be 10 using ammonium solution. After the hydrolysis for 1 hour at 26° C., the hydrolysate was mixed with 0.727 g (0.0027 mol) of tellurium chloride. After stirring the mixture for 5 minutes at 26° C., 0.08 g of SiAlON was added to the mixture. After the drying process in a similar manner as Example 1, fluorescent material-dispersed glass of Example 18 was prepared.

Example 19

0.54 ml (0.03 mol) of water was added to 3.12 g (0.015 mol) of tetraethoxysilane and 2.76 g (0.006 mol) of ethanol, where pH of the water was controlled to be 2 using hydrochloric acid. After stirring the mixture for 6 hours at 50° C., the mixture was added with 0.404 g (0.0015 mol) of tellurium chloride and was stirred for 24 hours. After that, the mixture was added with 0.08 g of SiAlON, and was dried in the same manner as Example 1. Thus, fluorescent material-dispersed glass of Example 19 was prepared.

Example 20

A fluorescent material-dispersed glass of Example 20 was prepared in a similar manner as Example 19 except that 0.044 g of SiAlON fluorescent material was added.

Comparative Example 1

Production of oxynitride fluorescent material glass was tried in the same manner as Example 1 except that 8.08 g (0.053 mol) of tetramethoxysilane, 1.9 ml (0.106 mol) of water of pH2, and 6.14 g (0.023 mol) of tellurium chloride were used. However, the tellurium chloride was not dissolved completely.

Comparative Example 2

Production of oxynitride fluorescent material glass was tried in the same manner as Example 1 except that 8.08 g (0.053 mol) of tetramethoxysilane, 1.90 ml (0.106 mol) of water of pH 2, and 14.27 (0.053 mol) of tellurium chloride were used. However, the tellurium chloride was not dissolved completely.

Comparative Example 3

Firstly 1.43 g (0.0053) mol of tellurium chloride was mixed with tetramethoxysilane of 8.08 g (0.053 mol).
Next, after stirring 1 hour at room temperature, 0.08 g of SiAlON fluorescent material was added to the mixture. Next, temperature was raised from room temperature to 80° C. with heating rate of 80° C./h, and the mixture was stirred for 40 minutes. Next, the temperature was raised to 150° C. with a heating rate of 2.9° C./h. As a result, gray colored dry gel was obtained. Precipitation of $Te_6O_{11}C_2$ crystals in the dry gel was confirmed.

Comparative Example 4

Production of oxynitride fluorescent material glass was tried in the same manner as Comparative Example 3 except that 8.08 g (0.053 mol) of tetramethoxysilane, 6.14 g (0.023 mol) of tellurium chloride, and reaction temperature of 26° C. were used. As a result, gray colored dry gel was obtained.

Comparative Example 5

Production of oxynitride fluorescent material glass was tried in the same manner as Example 14 except that 3.07 g (0.211 mol) of tellurium chloride and 6.76 g (0.211 mol) of methanol were used. However, the obtained glass was white colored due to precipitation of $TeO_2$ from the glass.

Comparative Example 6

Production of oxynitride fluorescent material-dispersed glass was tried in the same manner as Comparative Example 5 except that reaction temperature of 80° C. was used. However, the resultant material had powdered form and oxynitride fluorescent material-dispersed glass could not be formed in Comparative Example 6.

Comparative Example 7

Production of oxynitride fluorescent material-dispersed glass of Comparative Example 7 was tried in the same manner as Example 1 except that 0.846 g (0.0053 mol) of $TeO_2$ was used in place of $TeCl_4$. $TeO_2$ was not dissolved in the sol.

Comparative Example 8

Production of oxynitride fluorescent material-dispersed glass was tried in the same manner as Example 15 except that hydrolysis of tetraethoxysilane was performed for 6 hours at 50° C. using 1.08 g (0.06 mol) of water, and that 3.46 g (0.013 mol) of tellurium chloride was used, and the amount of methanol for dissolving the tellurium chloride was controlled to be 4.11 g (0.128 mol). However, the obtained glass was devitrified by precipitates and showed white coloring.

Comparative Example 9

Production of oxynitride fluorescent material-dispersed glass was tried in the same manner as Example 10 except that hydrolysis before the addition of fluorescent material was performed for 3 hours at 50° C. using 1.08 g (0.06 mol) of water and 3.46 g (0.013 mol) of tellurium chloride. However, the obtained glass was devitrified by precipitates and showed white coloring.

Comparative Example 10

Fluorescent material-dispersed glass was produced in the same manner as Example 18 except that 2.18 g (0.0081 mol) of tellurium chloride was used. As a result, glass was white colored, and $TeO_2$ and $Te_6O_{11}Cl_{12}$ were formed in the glass.

Experimental conditions and results of experiments were summarized in Table 1, Table 2, and Table 3. In the column of hydrolysis process in the Tables, 1 denotes a process where $TeCl_4$ is mixed to hydrolysate after hydrolysis of tetramethoxysilane (TMOS), II denotes a process where hydrolysis is performed after mixing $TeCl_4$ in TMOS, III denotes a process where $TeCl_4$ dissolved in methanol is mixed with hydrolysate after the hydrolysis of TMOS, IV denotes a process where TMOS added with methanol is subjected to hydrolysis, and is subsequently mixed with $TeCl_4$, and V denotes a process where tetraethoxysilane (TEOS) added with ethanol is subjected to hydrolysis, and is subsequently added with $TeCl_4$. I' denotes a process where TMOS is subjected to hydrolysis, and is subsequently mixed with $TeO_2$.

TABLE 1

|  | Hydrolysis process | TMOS (mol) | TeCl4. (mol) | H2O ml | H2O mol | H2O pH | methanol (mol) | SiAlON (g) | Hydrolysis Time (h) | Hydrolysis Temperature (°C.) | Success/Failure of vitrification |
|---|---|---|---|---|---|---|---|---|---|---|---|
| EXAMPLE 1 | I | 0.053 | 0.0053 | 1.9 | 0.106 | 2 | — | 0.08 | 6 | 50 | Vitrified |
| EXAMPLE 2 | I | 0.053 | 0.0053 | 1.9 | 0.106 | 2 | — | 0.08 | 3 | 50 | Vitrified |
| EXAMPLE 3 | I | 0.053 | 0.0053 | 1.9 | 0.106 | 2 | — | 0.08 | 10 | 50 | Vitrified |
| EXAMPLE 4 | I | 0.053 | 0.013 | 1.9 | 0.106 | 2 | — | 0.08 | 6 | 50 | Vitrified |
| EXAMPLE 5 | II | 0.053 | 0.0053 | 1.9 | 0.106 | 2 | — | 0.08 | 1/3 | 26 | Vitrified |
| EXAMPLE 6 | I | 0.053 | 0.0053 | 1.9 | 0.106 | 2 | — | 0.02 | 6 | 50 | Vitrified |
| EXAMPLE 7 | I | 0.053 | 0.0053 | 1.9 | 0.106 | 2 | — | 0.2 | 6 | 50 | Vitrified |
| EXAMPLE 8 | I | 0.053 | 0.0053 | 1.9 | 0.106 | 3 | — | 0.08 | 6 | 50 | Vitrified |
| EXAMPLE 9 | I | 0.053 | 0.0053 | 1.9 | 0.106 | 4 | — | 0.08 | 6 | 50 | Vitrified |
| EXAMPLE 10 | II | 0.03 | 0.0033 | 1.2 | 0.067 | 2 | — | 0.04 | 3 | 26 | Vitrified |
| EXAMPLE 11 | II | 0.03 | 0.0033 | 1.2 | 0.067 | 2 | — | 0.04 | 3 | 50 | Vitrified |
| EXAMPLE 12 | II | 0.03 | 0.0033 | 1.2 | 0.067 | 10 | — | 0.04 | 3 | 26 | Vitrified |
| EXAMPLE 13 | II | 0.03 | 0.0033 | 1.2 | 0.067 | 10 | — | 0.04 | 3 | 50 | Vitrified |

TABLE 2

|  | Hydrolysis process | TMOS (mol) | TEOS (mol) | TeCl$_4$ (mol) | H$_2$O ml | H$_2$O mol | H$_2$O pH | Methanol (mol) | Ethanol (mol) | SiAlON (g) | Hydrolysis Time (h) | Hydrolysis Temperature (°C.) | Success/Failure of Vitrification |
|---|---|---|---|---|---|---|---|---|---|---|---|---|---|
| EXAMPLE 14 | III | 0.027 | — | 0.0027 | 0.972 | 0.054 | 2 | 0.051 | — | 0.08 | 6 | 50 | Vitrified |
| EXAMPLE 15 | III | 0.03 | — | 0.0033 | 1.08 | 0.06 | 2 | 0.06 | — | 0.04 | 7 | 50 | Vitrified |
| EXAMPLE 16 | III | 0.03 | — | 0.0033 | 1.08 | 0.06 | 2 | 0.06 | — | 0.04 | 3 | 50 | Vitrified |
| EXAMPLE 17 | III | 0.03 | — | 0.0033 | 1.08 | 0.06 | 2 | 0.12 | — | 0.04 | 3 | 50 | Vitrified |
| EXAMPLE 18 | IV | 0.027 | — | 0.0027 | 1.94 | 0.108 | 10 | 0.0108 | — | 0.08 | 1 | 26 | Vitrified |
| EXAMPLE 19 | V | — | 0.015 | 0.0015 | 0.54 | 0.03 | 2 | — | 0.06 | 0.08 | 6 | 50 | Vitrified |
| EXAMPLE 20 | V | — | 0.015 | 0.0015 | 0.54 | 0.03 | 2 | — | 0.06 | 0.044 | 6 | 50 | Vitrified |

TABLE 3

|  | Hydrolysis process | TMOS (mol) | TeCl$_4$ (mol) | TeO$_2$ (mol) | H$_2$O ml | H$_2$O mol | H$_2$O pH | Methanol (mol) | SiAlON (g) | Hydrolysis Time (h) | Hydrolysis Temperature (°C.) | Success/Failure of Vitrification |
|---|---|---|---|---|---|---|---|---|---|---|---|---|
| COMPARATIVE 1 | I | 0.053 | 0.023 | — | 1.9 | 0.106 | 2 | — | 0.04 | 6 | 50 | Not solved |
| COMPARATIVE 2 | I | 0.053 | 0.053 | — | 1.9 | 0.106 | 2 | — | 0.04 | 6 | 50 | Not solved |
| COMPARATIVE 3 | — | 0.053 | 0.0053 | — | — | — | — | — | 0.08 | — | — | Gray gel |
| COMPARATIVE 4 | — | 0.053 | 0.023 | — | — | — | — | — | 0.08 | — | — | Gray gel |
| COMPARATIVE 5 | III | 0.027 | 0.011 | — | 0.972 | 0.054 | 2 | 0.211 | 0.08 | 6 | 50 | Partial crystallization |
| COMPARATIVE 6 | III | 0.027 | 0.011 | — | 0.972 | 0.054 | 2 | 0.211 | 0.08 | 6 | 80 | Partial pulverization |
| COMPARATIVE 7 | I' | 0.053 | — | 0.0053 | 1.9 | 0.106 | 2 | — | 0.08 | 6 | 50 | Not solved |
| COMPARATIVE 8 | III | 0.03 | 0.013 | — | 1.08 | 0.06 | 2 | 0.128 | 0.04 | 6 | 50 | White color |
| COMPARATIVE 9 | II | 0.03 | 0.013 | — | 1.08 | 0.06 | 2 | — | 0.04 | 3 | 50 | White color |
| COMPARATIVE 10 | IV | 0.027 | 0.0081 | — | 1.94 | 0.108 | 10 | 0.0108 | 0.08 | 1 | 26 | White color |

Example 21

1.8 g (0.1 mol) of water was dropped in a mixed solution of 2.74 g (0.018 mol) of tetramethoxysilane, 0.114 g (0.0006 mol) of titanium chloride, and 0.398 g (0.0014 mol) of titanium isopropoxide, where pH value of the water was controlled to be 1 using hydrochloric acid. After adding 1.8 g (0.056 mol) of methanol to the solution, the solution was stirred. After that, 6.12 g (0.06 mol) of propylene carbonate was added, and stirring was performed for 150 hours at 26° C. until the viscosity of the sol reaching to 1000 mPa·s or more. The sol was converted to gel after adding 0.062 g of SiAlON fluorescent material. Temperature of the gel was raised with a heating rate of 1.7° C./h, and dry gel was obtained after drying the gel for 1 hour at 120° C. Temperature of the dry gel was raised to 400° C. with a heating rate of 4.2° C./h, and further raised to 1000° C. with a heating rate of 8.3° C./h. After retaining the gel for 1 hour, the gel was spontaneously cooled in the electric furnace. Thus, oxynitride fluorescent material glass of Example 21 was obtained.

Example 22

Fluorescent material glass of Example 22 was prepared in the same manner as Example 21 except that 0.012 g of SiAlON was added.

Example 23

Fluorescent material glass of Example 23 was prepared in the same manner as Example 22 except that 0.12 g of SiAlON was added.

Example 24

Oxynitride fluorescent material glass of Example 24 was prepared in the same manner as Example 21 except that 2.13 g (0.014 mol) of tetramethoxysilane, 0.34 g (0.0018 mol) of titanium chloride, 1.19 g (0.0042 mol) of titanium isopropoxide, and 5.94 g (0.058 mol) of propylene carbonate were used.

Example 25

Oxynitride fluorescent material glass of Example 25 was prepared in the same manner as Example 21 except that 2.44 g (0.016 mol) of tetramethoxysilane, 0.23 g (0.0012 mol) of titanium chloride, 0.80 g (0.0028 mol) of titanium isopropoxide, were used.

Example 26

Oxynitride fluorescent material glass of Example 25 was prepared in the same manner as Example 26 except that 5.76 g (0.056 mol) of propylene carbonate was used.

Example 27

Oxynitride fluorescent material glass of Example 27 was prepared in the same manner as Example 25 except that 5.94 g (0.058 mol) of propylene carbonate was used.

Example 28

Oxynitride fluorescent material glass of Example 28 was prepared in the same manner as Example 21 except that 2.04 g (0.02 mol) of propylene carbonate was used.

Example 29

Oxynitride fluorescent material glass of Example 29 was prepared in the same manner as Example 21 except that 0.15 g (0.0008 mol) of titanium chloride, 0.34 g of titanium isopropoxide (0.0012 mol), 1.96 g (0.019 mol) of propylene carbonate were used.

Example 30

Fluorescent material glass of Example 30 was prepared in the same manner as Example 21 except that 0.15 g (0.0008 mol) of titanium chloride and 0.34 g of titanium isopropoxide (0.0012 mol) were used.

Example 31

Fluorescent material glass of Example 31 was prepared in the same manner as Example 21 except that 0.08 g (0.0004 mol) of titanium chloride and 0.45 g of titanium isopropoxide (0.0016 mol) were used.

Example 32

Fluorescent material glass of Example 32 was prepared in the same manner as Example 21 except that 0.08 g (0.0004 mol) of titanium chloride, 0.45 g (0.0016 mol) of titanium isopropoxide, and 2.00 g (0.02 mol) of propylene carbonate were used.

Example 33

Fluorescent material glass of Example 33 was prepared in the same manner as Example 21 except that water of pH 2 was used.

Example 34

1.8 g (0.1 mol) of water was dropped in a mixed solution of 2.74 g (0.018 mol) of tetramethoxysilane, 0.114 g (0.0006 mol) of titanium chloride, and 0.398 g (0.0014 mol) of titanium isopropoxide, where pH value of the water was controlled to be 1 using hydrochloric acid. Then, 1.8 g (0.056 mol) of methanol was added to the solution. The solution was stirred in the same manner as Example 21. After that, 4.30 g (0.059 mol) of dimethylformamide (DMF) was added to the sol, and a fluorescent material glass of Example 34 was prepared in the same manner as Example 21.

Comparative Example 11

Fluorescent material glass of Comparative Example 11 was prepared by using the same manner as Example 21 except that 1.83 g (0.012 mol) of tetramethoxysilane, 0.303 g (0.0016 mol) of titanium chloride, 1.82 g (0.0064 mol) of titanium isopropoxide were used. As a result, opaque sintered body was obtained.

Comparative Example 12

A sol was prepared in the same manner as Example 21 except that 1.22 g (0.008 mol) of tetramethoxysilane, 0.455 g (0.0024 mol) of titanium chloride, and 2.73 g (0.0096 mol) of titanium isopropoxide were used. A glass could not be produced since the gelation of the sol did not occur.

Comparative Example 13

The experiment was performed in the same manner as Example 21 except that water of pH 3 was used. As a result, precipitate was formed during forming the sol, and a homogeneous gel could not be prepared.

Experimental conditions and results of experiments are summarized in Table 4 and Table 5. In the Tables, $Ti(OiPr)_4$ denotes a titanium isopropoxide, and DMF denotes a dimethylformamide.

TABLE 4

| | TMOS (mol) | $TiCl_4$ (mol) | $Ti(OiPr)_4$ (mol) | $H_2O$ ml | $H_2O$ mol | $H_2O$ pH | Methanol (mol) | Propylene carbonate (mol) | DMF (mol) | SiAlON (g) | Success/Failure of Vitrification |
|---|---|---|---|---|---|---|---|---|---|---|---|
| EXAMPLE 21 | 0.018 | 0.0006 | 0.0014 | 1.8 | 0.1 | 1 | 0.056 | 0.060 | — | 0.062 | Vitrified |
| EXAMPLE 22 | 0.018 | 0.0006 | 0.0014 | 1.8 | 0.1 | 1 | 0.056 | 0.060 | — | 0.012 | Vitrified |
| EXAMPLE 23 | 0.018 | 0.0006 | 0.0014 | 1.8 | 0.1 | 1 | 0.056 | 0.060 | — | 0.12 | Vitrified |
| EXAMPLE 24 | 0.014 | 0.0006 | 0.0042 | 1.8 | 0.1 | 1 | 0.056 | 0.058 | — | 0.062 | Vitrified |
| EXAMPLE 25 | 0.016 | 0.0012 | 0.0028 | 1.8 | 0.1 | 1 | 0.056 | 0.060 | — | 0.062 | Vitrified |

TABLE 4-continued

| | TMOS (mol) | TiCl$_4$ (mol) | Ti(OiPr)$_4$ (mol) | H$_2$O ml | H$_2$O mol | H$_2$O pH | Methanol (mol) | Propylene carbonate (mol) | DMF (mol) | SiAlON (g) | Success/Failure of Vitrification |
|---|---|---|---|---|---|---|---|---|---|---|---|
| EXAMPLE 26 | 0.016 | 0.0012 | 0.0028 | 1.8 | 0.1 | 1 | 0.056 | 0.056 | — | 0.062 | Vitrified |
| EXAMPLE 27 | 0.016 | 0.0012 | 0.0028 | 1.8 | 01 | 1 | 0.056 | 0.058 | — | 0.062 | Vitrified |
| EXAMPLE 28 | 0.018 | 0.0006 | 0.0014 | 1.8 | 0.1 | 1 | 0.056 | 0.020 | — | 0.062 | Vitrified |
| EXAMPLE 29 | 0.018 | 0.0008 | 0.0012 | 1.8 | 0.1 | 1 | 0.056 | 0.019 | — | 0.062 | Vitrified |
| EXAMPLE 30 | 0.018 | 0.0008 | 0.0012 | 1.8 | 0.1 | 1 | 0.056 | 0.060 | — | 0.062 | Vitrified |
| EXAMPLE 31 | 0.018 | 0.0004 | 0.0016 | 1.8 | 0.1 | 1 | 0.056 | 0.060 | — | 0.062 | Vitrified |
| EXAMPLE 32 | 0.018 | 0.0004 | 0.0016 | 1.8 | 0.1 | 1 | 0.056 | 0.020 | — | 0.062 | Vitrified |
| EXAMPLE 33 | 0.018 | 0.0006 | 0.0014 | 1.8 | 0.1 | 2 | 0.056 | 0.060 | — | 0.062 | Mostly vitrified |
| EXAMPLE 34 | 0.018 | 0.0006 | 0.0014 | 1.8 | 01 | 1 | 0.056 | — | 0.060 | 0.062 | Vitrified |

TABLE 5

| | TMOS (mol) | TiCl$_4$ (mol) | Ti(OiPr)$_4$ (mol) | H$_2$O ml | H$_2$O mol | H$_2$O pH | Methanol (mol) | Propylene carbonate (mol) | DMF (mol) | SiAlON (g) | Success/Failure of Vitrification |
|---|---|---|---|---|---|---|---|---|---|---|---|
| COMPARATIVE 11 | 0.012 | 0.0016 | 0.0064 | 1.8 | 0.1 | 1 | 0056 | 0.60 | — | 0.062 | White coloring |
| COMPARATIVE 12 | 0.008 | 0.0024 | 0.0096 | 1.8 | 0.1 | 1 | 0.056 | 0.60 | — | 0.062 | No gelation |
| COMPARATIVE 13 | 0.018 | 0.0006 | 0.0014 | 1.8 | 0.1 | 3 | 0.056 | 0.60 | — | — | Deposit |

Example 35

While stirring a mixture of 4.57 g (0.03 mol) of tetramethoxysilane, 0.75 g (0.003 mol) of tin chloride dihydrade, and 1.07 g (0.03 mol) of methanol, water of a controlled pH value of pH 2 was dropped in the mixture, and the stirring was continued. The mixture was stirred after added with 0.11 g of SiAlON, thereby obtaining fluorescent material-dispersed sol. Next, a fluorescent material-dispersed gel was prepared by aging the fluorescent material-dispersed sol for 1 hour at 26° C. The fluorescent material-dispersed gel was dried and sintered in the same manner as Example 1. The thus prepared fluorescent material-dispersed glass 35 was a transparent glass.

As shown in the above-described explanation and Tables 1 to 5, vitrification was successful in the Examples according to the present invention. On the other hand, transparent bulk glass was not formed in Comparative Examples due to formation of deposits or precipitates, or due to pulverization.

INDUSTRIAL APPLICABILITY

The fluorescent material-dispersed glass and a manufacturing method according to the present invention can provide a fluorescent material-dispersed glass of high quantum efficiency that disperses fluorescent material of high refractive index in the glass of high refractive index by a simple manufacturing method while avoiding reaction of the fluorescent material with the glass. Application of the fluorescent material-dispersed glass in a light emitting element enables increase of brightness of the element and realizes multi-color element. Therefore, the present invention is applicable in LED industries and lightning industries.

The invention claimed is:

1. A method of manufacturing fluorescent material-dispersed glass, comprising:
    performing production of a fluorescent material-dispersed gel utilizing sol-gel reaction and acid-base reaction by preparing a fluorescent material-dispersed sol containing silicon alkoxide, metal chloride and/or metal alkoxide, and fluorescent material while avoiding reacting of the fluorescent material with the sol, and subsequently gelling the fluorescent material-dispersed sol; and
    performing production of a fluorescent material-dispersed glass by heating the fluorescent material-dispersed gel while avoiding reaction of the fluorescent material with the glass,
    wherein the production of the fluorescent material-dispersed sol includes preparing a precursor sol using the silicon alkoxide, the metal chloride and/or metal alkoxide, and water, and preparing the fluorescent material-dispersed sol by dispersing the fluorescent material in the precursor sol after controlling viscosity of the precursor sol to be in the range of 100 to 10000 mPa·s.

2. The method of manufacturing a fluorescent-material dispersed glass according to claim 1, wherein the silicon alkoxide is shown by a formula, Si(OR)$_4$, the metal chloride is shown by a formula, MCl$_n$, and the metal alkoxide is shown by a formula, M(OR)$_n$, where the OR denotes one alkoxyl group selected from methoxy group, ethoxy group, propoxy group, isopropoxy group, and butoxy group, M denotes a metal selected from Te, Ti, and Sn, and n is 2 or 4.

3. The method of manufacturing a fluorescent-material dispersed glass according to claim 1, wherein the fluorescent material-dispersed sol is prepared such that an amount of the metal chloride and/or the metal alkoxide is controlled to be less than 3/7 mol per 1 mol of the silicon alkoxide.

4. The method of producing fluorescent material-dispersed glass according to claim 1, wherein the amount of the fluorescent material in the fluorescent material-dispersed glass is 10% by mass or less.

5. The method of manufacturing a fluorescent material dispersed glass according to claim 1, wherein the fluorescent material is constituted of a material selected from nitride, oxide, and oxynitride.

6. The method of manufacturing a fluorescent material dispersed glass according to claim 5, wherein the oxynitride is a SiAlON.

7. The method of manufacturing a fluorescent material dispersed glass according to claim 1, wherein the precursor sol is prepared by mixing the silicon alkoxide and the metal chloride and/or metal alkoxide to form a mixture, and performing hydrolysis of the mixture by adding water to the mixture.

8. The method of manufacturing a fluorescent material dispersed glass according to claim 1, wherein the precursor sol is prepared by performing hydrolysis by adding water to the silicon alkoxide, and subsequently adding the metal chloride and/or the metal alkoxide.

9. The method of manufacturing a fluorescent material dispersed glass according to claim 1, wherein pH of the water is less than 7.

10. The method of manufacturing a fluorescent material dispersed glass according to claim 1, wherein pH of the water is more than 7.

11. The method of manufacturing a fluorescent material dispersed glass according to claim 1, wherein, after preparing the fluorescent material-dispersed sol, aging the sol for 1 hour or longer at a temperature of 20° C. or more, thereby forming the fluorescent material-dispersed gel.

12. The method of manufacturing a fluorescent material dispersed glass according to claim 1, wherein a fluorescent material-dispersed glass is formed by heating the fluorescent material dispersed gel at a temperature of 350° C. or higher.

13. A fluorescent material-dispersed glass containing a $MO_n$-$SiO_2$ glass, fluorescent material dispersed in the $MO_n$—$SiO_2$ glass, wherein the $MO_n$ is one metal oxide selected from $TeO_2$, $TiO_2$, $SnO_2$, an amount of the $MO_n$ is 30 mol % or less, and an amount of the fluorescent material is 10% by mass or less.

* * * * *